(12) United States Patent
Iitsuka

(10) Patent No.: US 6,364,271 B2
(45) Date of Patent: Apr. 2, 2002

(54) STRUCTURE FOR INSTALLING AN ELECTRONIC APPARATUS

(75) Inventor: Yoshitune Iitsuka, Yokohama (JP)

(73) Assignee: Vertex Standard Co., Ltd., Tokyo (JP)

( * ) Notice: Subject to any disclaimer, the term of this patent is extended or adjusted under 35 U.S.C. 154(b) by 0 days.

(21) Appl. No.: 09/737,099

(22) Filed: Dec. 13, 2000

(30) Foreign Application Priority Data

Dec. 14, 1999 (JP) .......................................... 11-354392

(51) Int. Cl.$^7$ .............................................. A47G 29/00
(52) U.S. Cl. ............................ 248/371; 16/381; 16/387
(58) Field of Search ................................ 248/371, 397, 248/398, 291.1, 292.14, 506, 27.1, 299.1; 455/347; 16/381, 387

(56) References Cited

U.S. PATENT DOCUMENTS

| | | | | |
|---|---|---|---|---|
| 1,289,830 A | * | 12/1918 | Leimecke | |
| 3,206,788 A | * | 9/1965 | Hahn | 15/235.8 |
| 3,516,115 A | * | 6/1970 | Koleske | 16/150 |
| 3,844,518 A | * | 10/1974 | Long | 248/188.4 |
| 6,152,554 A | * | 11/2000 | Parisi | 312/405 |

* cited by examiner

*Primary Examiner*—Anita King
*Assistant Examiner*—Ingrid Weinhold
(74) *Attorney, Agent, or Firm*—Fulwider Patton Lee & Utecht, LLP

(57) ABSTRACT

An electronic apparatus installation structure has an adapter with rotatably supporting a rotating shaft, and having a bearing part having elongated holes that cause exposure of screw holes and a pin hole of a rotating shaft and a base part. A pin of the rotating shaft is pressed into the pin hole, thereby restraining thrust-direction movement, and also limiting the swinging range of the rotating shaft. Through holes are provided on a radio apparatus at locations corresponding to the screw holes on the rotating shaft, and mounting screws are used to fix the radio apparatus to the bearing part of the adapter.

4 Claims, 5 Drawing Sheets

STRUCTURE FOR INSTALLING AN ELECTRONIC APPARATUS

BACKGROUND OF THE INVENTION

1. Field of the Invention

The invention relates to a structure for installing an electronic apparatus such as a lightweight, compact radio apparatus or measuring apparatus, providing a function for adjusting the inclination angle thereof, and suitable for use in installation in a narrow space.

2. Description of the Related Art

In recent years, with dramatic advancements in the integration of electronic circuitry, efforts have been made to achieve compactness in radio equipment for amateur radio and commercial radio services, this combining with motorization to result in a great increase in the population of mobile stations.

Radio equipment for use aboard vehicles is generally mounted into a dashboard of a vehicle, and although compact radio equipment has been developed, the dashboard still provides only a limited amount of space, providing a cramped installation for such equipment.

In the past, in installing radio equipment in a vehicle, the configurations shown in FIG. 9 and FIG. 10 have been used. In these drawings, the reference numeral 51 denotes a radio apparatus, and 52 is a bracket.

The bracket 52 is made of sheet metal, bent into a U-shape by pressing, and is formed by a bottom part 53 and side parts 54 and 55 on either side thereof, and usually has approximately four mounting holes formed at appropriate locations in the bottom part, the bracket 52 being screw-mounted to a shelf surface of a dashboard 56 using these mounting holes.

The side parts 54 and 55 of the bracket 52 have, at corresponding locations thereof, round holes 57 and elongated holes 58 formed along an arc having the round holes 57 as their centers. The side covers 59 and 60 on each side of the radio apparatus 51 have two threaded holes formed with a horizontal distance therebetween that corresponds to the radii of the arcs, screws 61 and 62 passing through the round holes 57 and the elongated holes 58 of the bracket 52 and being screwed into the threaded holes of the radio apparatus 51, thereby side-suspending the radio apparatus 51 between the side parts 54 and 55 of the bracket 52.

In the above-noted case, because the screws 62 screwed into the side covers 59 of the radio apparatus 51 are movable along the elongated holes 58 of the side parts 54 and 55, the radio apparatus is side-suspended in a manner that permits it to rock about a straight line joining the axes of the screws 61 of the side covers 59 and 60, making it possible to fix the radio apparatus 51 at a desired angle by adjusting the radio apparatus to the desired angle and then tightening the screws 62.

With a radio apparatus for a vehicle mounted into the dashboard thereof, because there is a considerable difference between the eye height of an operator and the height of the operating panel, making it impossible for the operator to view the operating panel front-on, and because in the case in which a liquid-crystal display is provided on the operating panel there is a limitation to the viewing angle, it becomes difficult to verify the operating status or data of the radio apparatus, making the above-noted angle adjustment and fixing function necessary in order to establish ease of operation.

Electronic apparatuses such as radio equipment or measuring equipment often have operating panels that are rectangular, with the longer dimension being the horizontal dimension, and there are installation locations that do not provide sufficient width for installation.

For example, taking the case of the above-noted vehicular radio apparatus, a limitation will be imposed by the width of the dashboard, leading to cases in which the bracket 52, as shown in FIG. 10, fits into the dashboard 56, but in which there is only an extremely small space between the side walls 63 and 64 of the dashboard 56 and the side parts 54 and 55 of the bracket 52.

In this case, it is not possible to screw the bracket 52 into the dashboard 56 with the radio apparatus 51 side-suspended by the bracket 52, and even if an attempt is made to first mount the bracket 52 to the dashboard 56 and then mount the radio apparatus 51 to the bracket 52, it is difficult to screw in the screws 61 and 62, and nearly impossible to tighten the screws 62 while adjusting the inclination angle of radio apparatus 51.

Accordingly, it is an object of the present invention to provide a structure having a function enabling adjustable setting of the inclination angle of an electronic apparatus, and, in the case in which the electronic apparatus is installed on a surface of a shelf or wall, enabling uninhibited mounting, even if there is insufficient extra width in the installation location.

SUMMARY OF THE INVENTION

In order to achieve the above-noted objects, the present invention adopts the following basic technical constitution.

Specifically, the present invention is an electronic apparatus installation structure having an adapter in which a bearing part that rotatably supports a rotating shaft that has one screw hole or a plurality of screw holes arranged in a line along the axis of a round rod and a base part that supports the bearing part are integrally formed, a surface of the bearing part that is on the opposite side from the base part being formed as a substantially arc-shaped surface about the axis as a center, an elongated hole being formed in a circumferential direction at a location on the arc-shaped surface opposing a screw hole of the rotating shaft, and in which a restraining mechanism provides restraint so that the screw hole between the rotating shaft and the bearing part does not exceed the limit over which the elongated hole is formed and move and rotate in the axial or circumferential directions, and an electronic apparatus having a through hole at a location corresponding to the screw hole on the adapter side, wherein the base part of the adapter is fixed to an installation location on the electronic apparatus, a mounting screw being passed through the through hole on the electronic apparatus and screwed into the screw hole on the adapter side, thereby fixing the electronic apparatus to the adapter.

In the present invention, the adaptor is fixed in place by mounting the base part thereof to a shelf surface or to a wall surface. In this case, although the generally used means for fixing is that of forming a hole in the base part and using a screw thereat, it will be understood that other mechanical fixing means or an adhesive can alternatively be used.

When an electronic apparatus is to be installed in a vehicle by placement from above, the bottom cover thereof is in contact with the substantially arc-shaped curved surface of the bearing part, and if the electronic apparatus is to be installed in a vehicle by suspension, the upper cover thereof is in contact with the substantially arc-shaped curved surface of the bearing part, and is held in place by a mounting screw. Because the screw hole of the rotating shaft is movable along the elongated hole formed in the substantially arc-shaped curved surface of the bearing part, in the condition in which the mounting screw is not tightened, it is possible for the electronic apparatus to be swung about the axis of the rotating shaft as a center.

Therefore, in the condition in which the mounting screw is not tightened, it is possible to adjust the electronic apparatus to a desired angle of inclination, and then tighten the mounting screw at the adjusted angle, so as to hold the electronic apparatus fixed with respect to the bearing part.

In the above-noted case, because the operation of tightening the mounting screw is performed from the top in the case in which the electronic apparatus is installed by placement from above and from the bottom in the case in which the electronic apparatus is installed by suspension from above, it is sufficient that the installation width be just a small amount greater than the width of the electronic apparatus.

The restraining mechanism between the rotating shaft and the bearing part keeps the screw hole always disposed within the range in which the elongated hole is formed, thereby serving to facilitate this operation.

Although there can be either one or a plurality of screw holes on the rotating shaft, firmer holding is possible with a plurality of holes, and in the case of a single hole there is the advantage of being able to swing the electronic apparatus about the mounting so as to adjust the angle of the operating panel surface.

The bearing part and the base part of the adapter can be fabricated by machining, casting, or by molding from resin, and can also be simply fabricated using a press operation.

Specifically, the various regions of a metal sheet making up the upper side and lower side of the bearing part are divided by a slit and an elongated hole is formed in the region constituting the upper side, after which the upper side region is pressed upward so as to form a substantially arc-shaped curved surface, and the lower side region is pressed upward so as to form as double-humped wave shape, thereby forming a bearing part internally encompassing a rotating shaft, enabling the part that is not pushed upward to serve as the base part.

Although the electronic apparatus is held in place in contact with the substantially arc-shaped curved surface of the adapter, the swinging thereof is restrained by the action of friction at both of the joined surfaces in both directions.

In this case, because the coefficient of friction at the joining surfaces is not that large and because the surface area of the joining surfaces is small, unless the tightening force of each mounting screw is made large, insufficient restraining is achieved.

With respect to this problem, a reasonable solution is to sandwich between the adapter and the electronic apparatus a rubber or resin sheet in which a hole for passage of the mounting screw is formed, or a metal sheet to which is adhered a rubber sheet or resin sheet to the side in contact with the adapter.

The construction of an electronic apparatus is often one in which an upper cover or lower cover is often mounted to an internal chassis, and these covers usually do not have sufficient rigidity as panels.

Therefore, if the mounting screws are strongly tightened, the cover not only deformed by flexure, but it becomes impossible to achieve sufficient restraint with respect to the above-noted swinging.

With respect to this problem, a reasonable solution is to devise an enclosure having a structure in which a cylindrical stud is interposed vertically between the adapter side cover and the cover on the opposite side at the location of the through hole for the mounting screw, and to pass the mounting screw through the stud and tighten it into the screw hole on the adapter side, thereby solving this problem.

BRIEF DESCRIPTIONS OF THE DRAWINGS

The above and other features of the present invention will be better understood by reading the description of exemplary embodiments to follow, making reference to the accompanying drawings, of which:

DETAILED DESCRIPTION OF THE PREFERRED EMBODIMENTS

Preferred embodiments of the present invention are described in detail below, with references made to FIG. 1 to FIG. 8.

Figure 1:
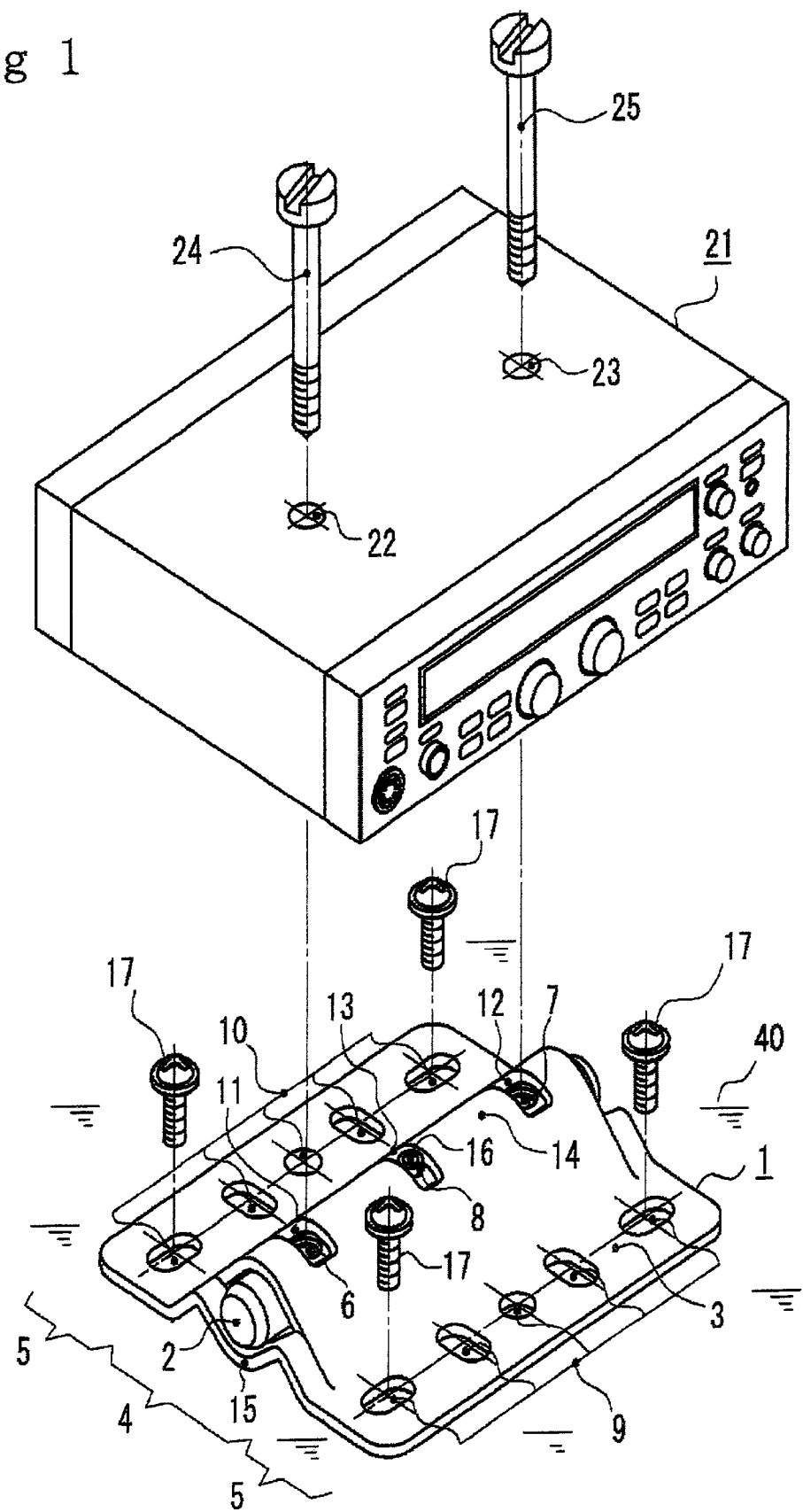
FIG. 1 is an outer perspective view showing the mounting condition between an adapter and a radio apparatus according to a first embodiment of the present invention.
Figure 2:
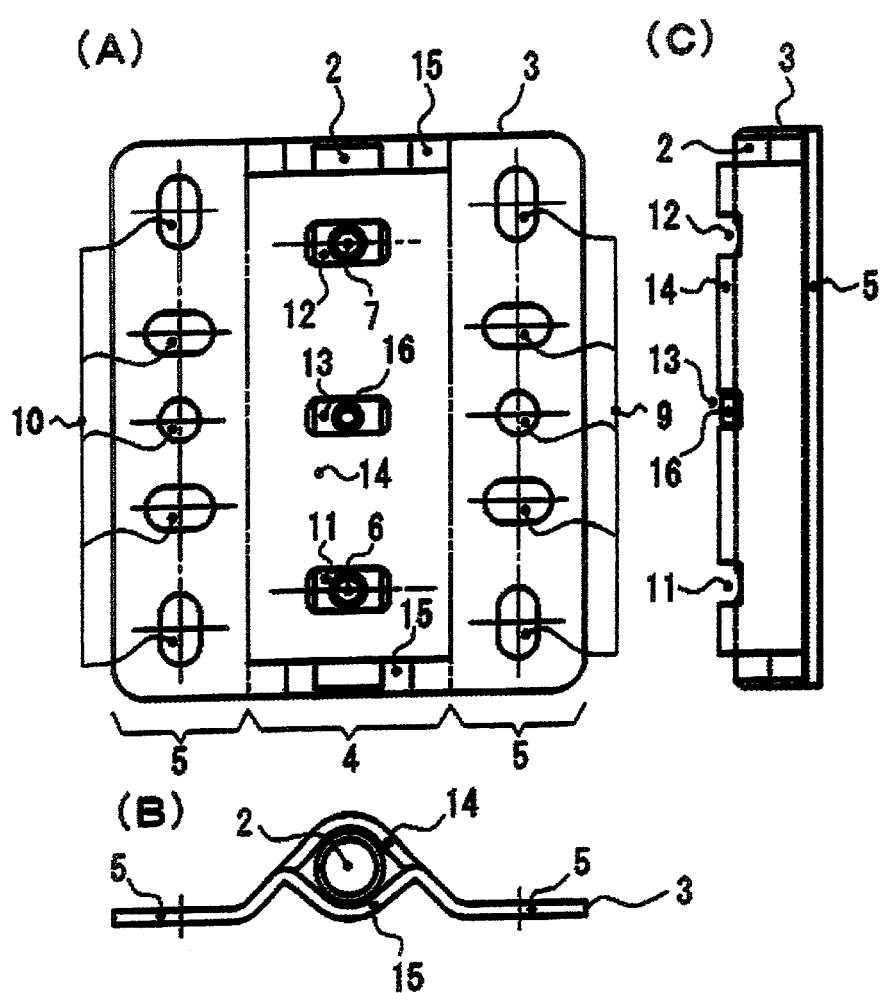
FIG. 2(A) is a plan view.
FIG. 2(B) is a front elevation.
FIG. 2(C) is a side elevation of the adapter of FIG. 1.

Specifically, FIG. 1 is an outer perspective view, showing the condition in which a vehicular radio apparatus is mounted, and indicating the locations of various mounting screws.

As shown in FIG. 1, an adapter 1 is formed by a rotating shaft 2 and a bracket 3, the bracket 3 being fabricated by a pressing operation so as to have an integrally formed bearing part 4 and base parts 5, the rotating shaft 2 being rotatably supported by the bearing part 4 thereof.

In this structure, the rotating shaft 2 has two through screw holes 6 and 7 to either end thereof and a through pin hole 8 at the center thereof, these screw holes 6 and 7 and pin hole 8 being arranged at positions alone a line in the axial direction of the rotating shaft 2.

The bracket 3 is formed by performing the following pressing operations with respect to a metal sheet.

(1) Punching out mounting holes 9 and 10 in regions corresponding to the base parts 5.

(2) In the same step as (1) or in a separate step, punching out elongated holes 11, 12, and 13, at locations corresponding to the screw holes 6 and 7 and pin hole 8 of the rotating shaft 2 to be rotatably supported, taking into consideration the swing angle of the rotating shaft 2 (corresponding to the desired angle of inclination of the radio apparatus).

(3) Forming slits in a region corresponding to the bearing part 4, which divide this region into prescribed regions at the ends thereof and a central region thereof. This step can be alternately performed before steps (1) or (2).

(4) Using a half-moon-shaped die to press upward an overall region corresponding to the bearing part 4 so as to achieve a radius of curvature of the radius of the rotating shaft 2.

(5) Of the part caused to be protruded upward in step (4), pressing only the prescribed regions at the ends thereof delineated by the slits formed in step (3) downward to achieve a double-humped wave shape using the same type of half-moon-shaped die as used in step (4), thereby forming a mechanism for rotatably supporting the rotating shaft 2 between the raised part 14 in the central region and the dropped parts 15 at the end parts.

The shapes formed in steps (4) and (5) can be achieved by a single pressing operation, by forming the upper and lower dies so as to achieve the final shape.

When the rotating shaft 2 is inserted into and side-suspended by the dropped parts of the bracket 3 formed by the above-noted process steps, the screw holes 6 and 7 and the pin hole 8 appear at the holes 11, 12, and 13 formed in step (2), and by inserting a pin 16 into the pin hole 8, the adapter 1 shown in the plan view, the front elevation, and the side elevation of FIGS. 2(A), (B), and (C), respectively, is completed.

The pin 16 is pressed into the elongated hole 13 so that it acts as a small protrusion engaging the inner wall of the elongated hole 13, without protruding upward beyond the surface of the raised part 14, this pressed-in pin 16 acting so that the rotating shaft 2 does not move in the axial direction with respect to the bracket 3, and also having the function of assuring that the screw holes 6 and 7 always appear within the elongated holes 11 and 12.

The adapter 1 configured as described above is screwed to the shelf surface 40 of the dashboard, using the holes 9 and 10 formed in the base part 5. In FIG. 1, the holes 9 and 10 in the four corners of the adapter 1 are shown in the condition in which they are held by screws 17.

In FIG. 1, through holes 22 and 23 are formed in the radio apparatus 21 in the thickness direction of the radio apparatus at a distance therebetween that corresponds to the spacing between the screw holes 6 and 7 of the adapter 1.

These through holes 22 and 23 are holes from the upper cover to the lower cover of the radio apparatus, which do not interfere with an internal chassis or printed circuit boards or the like, and are provided in the design, manufacturing, and assembly phases of the radio apparatus 21.

Mounting screws 24 and 25 are passed through the through holes 22 and 23 of the radio apparatus 21, and are screwed into the threaded part of the screw holes 6 and 7 of the adapter 1 fixed to the shelf surface 40 of the dashboard, thereby mounting the radio apparatus 21 to the adapter 1.

In this case, the mounting screws 24 and 25 are, of course, longer than the thickness of the radio apparatus 21, and are of a length such that, when they are screwed into the screw holes 6 and 7 of the adapter 1, they do not protrude downward.

Figure 3:
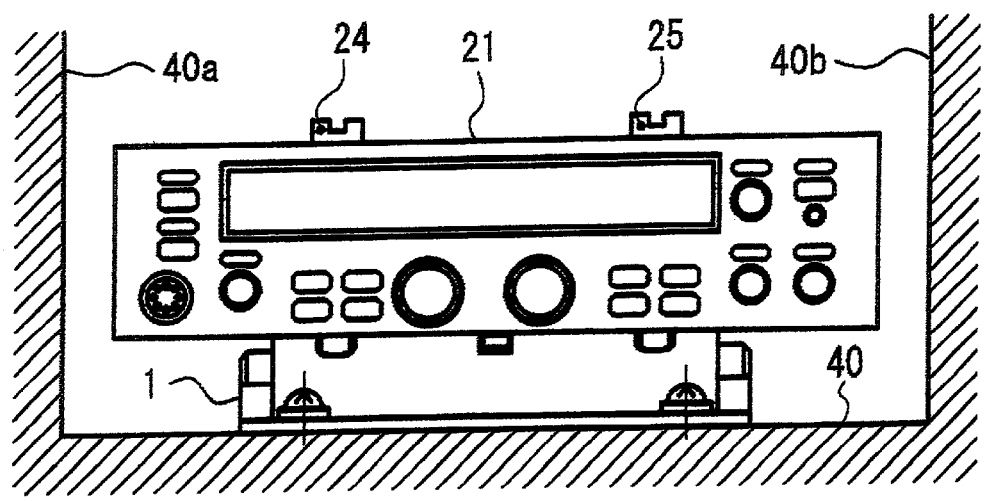
FIG. 3 is a front elevation showing the condition in which a radio apparatus is installed into a dashboard via the adapter of FIG. 1.
Figure 4:
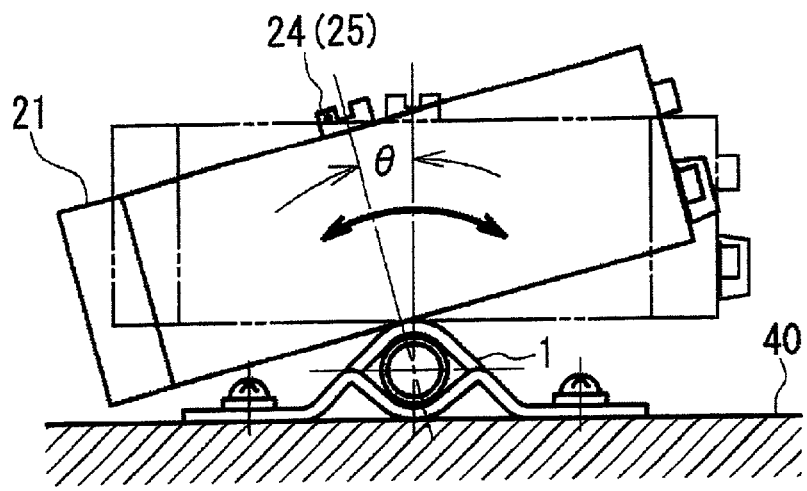
FIG. 4 is a side elevation showing the setting of the inclination angle of the radio apparatus.

Therefore, when the radio apparatus 21 is mounted to the adapter 1 while maintaining a horizontal attitude, it is installed onto the shelf surface 40 of the dashboard such as shown in FIG. 3. If the mounting screws 24 and 25 are not tightened strongly, however, the rotating shaft 2 of the adapter 1 is free to rotate within the bearing part 4, enabling the mounting screws 24 and 25 and the pin 16 to swing about the rotating shaft 2 as a center within the limits of the elongated holes 11, 12, and 13, and, because the surface of the raised part 14 of the bracket 3 in the adapter 1 has a substantially arc-shaped curved surface, it is possible to freely adjust the overall inclination angle of the radio apparatus 21, as shown in FIG. 4.

If the radio apparatus 21 is adjusted to some desired angle of inclination $\theta$ and then the mounting screws 24 and 25 are strongly tightened, the radio apparatus 21 is fixed at that angle to the adapter 1.

In this case, the task of tightening the mounting screws 24 and 25 can be performed from the top of the radio apparatus 21, and even in a case in which the spacing between the side walls 40a and 40b of the dashboard is narrow, as shown in FIG. 3, in which it is not possible to achieve sufficient space between these surfaces and the side surfaces of the radio apparatus 21, it is possible to perform the installation task without any hindrance.

Figure 5:
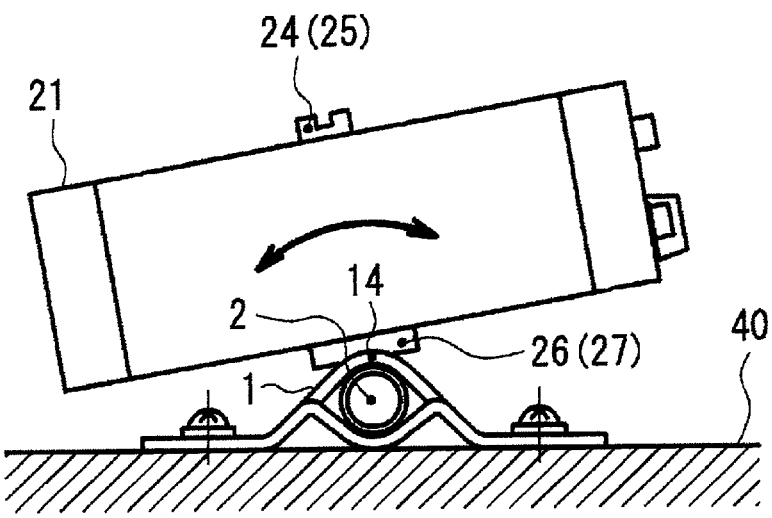
FIG. 5 is a side elevation showing the installation condition of a radio apparatus according to a second embodiment of the present invention.
Figure 6:
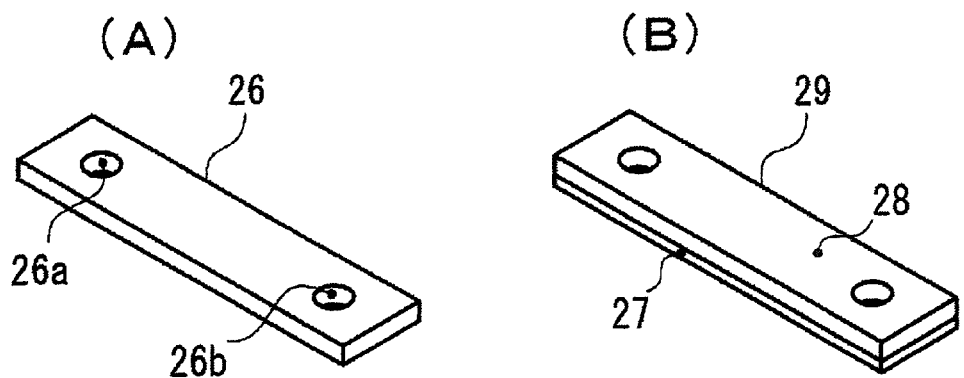
FIG. 6 are outer perspective views, FIG. 6(A) showing the rubber sheet and FIG. 6(B) showing the polymer sheet (B) used in the second embodiment of the present invention.

A second embodiment of the present invention is shown in FIG. 5.

According to the first embodiment, as shown in FIG. 3 and FIG. 4, the lower cover of the radio apparatus 21 and the bearing part 4 of the adapter 1 are in contact between a flat surface and an arc-shaped curved surface and, because both these surfaces are metal, the coefficient of friction therebetween is small.

For this reason, to prevent swinging of the radio apparatus 21, it is necessary to provide sufficient frictional force by strongly tightening the mounting screws 24 and 25.

However, the lower cover and upper cover of the radio apparatus 21 are often made of thin sheets, which would deform if the mounting screws 24 and 25 were to be tightened strongly.

Given the above, in the second embodiment of the present invention, a thin rubber sheet (or resin sheet) 26 is interposed between the lower cover and the of the radio apparatus 21 and the bearing part 4 of the adapter 1, and the mounting screws 24 and 25 are tightened strongly.

This rubber sheet 26, as shown in FIG. 6(A), is a flat sheet having a sheet in accordance with the shape of the region of contact between the adapter 1 and the radio apparatus 21, with holes 26a and 26b at locations therein corresponding to the screw holes 11 and 12 of the adapter 1, the mounting screws 24 and 25 passing through these holes 26a and 26b and being screwed into the rotating shaft 2.

In this manner, it is possible to achieve a large coefficient of friction by virtue of the insertion of the rubber sheet 26, the rubber sheet 26 deforming appropriately and providing an enlarged contact surface area, enabling the radio apparatus 21 to be held to the adapter 1, even without applying that much tightening force to the mounting screws 24 and 25.

Additionally, the rubber sheet has the effect of facilitating the task of adjusting the inclination angle of the radio apparatus 21, and preventing damage to the lower cover of the radio apparatus 21.

Alternately, by using a laminated sheet 29 formed by a rubber sheet 27 and a metal sheet 28, as shown in FIG. 6(B) in place of the rubber sheet 26, it is possible to distribute the pressure applied to the lower cover of the radio apparatus 21, thereby reducing the degree of deformation of the lower cover.

As a further improvement over the first and the second embodiments of the present invention, a third embodiment enables the tightening of the mounting screws 24 and 25, without having to be concerned about deformation of the upper or lower cover of the radio apparatus 21.

Figure 7:
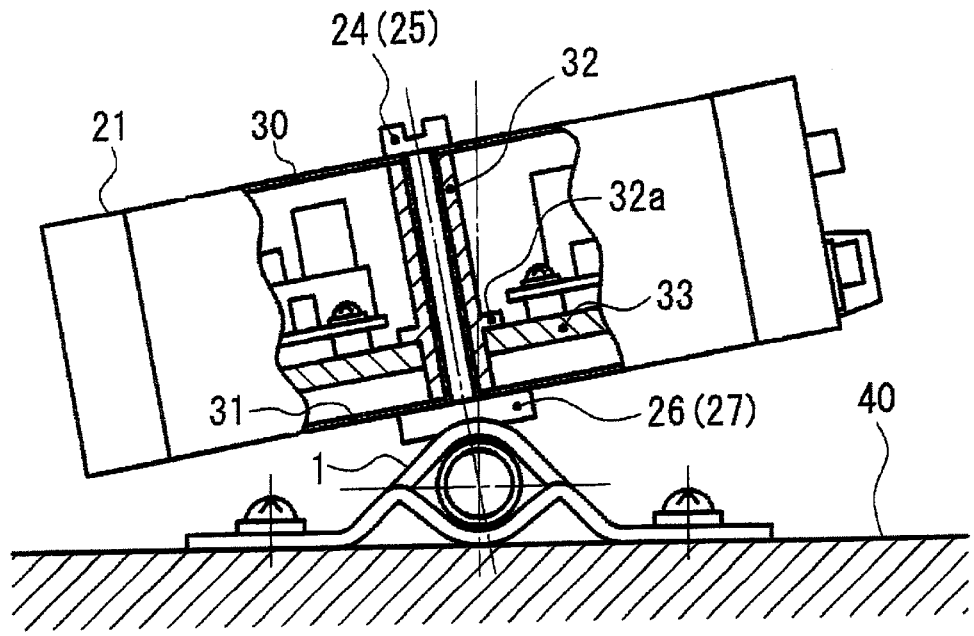
FIG. 7 is a side elevation showing the installation condition of a radio apparatus according to a third embodiment of the present invention, in which part of the radio apparatus is cut away to show the provision and holding of the vertical stud.

The configuration of the third embodiment is shown in FIG. 7, in which cylindrical studs are provided vertically between the upper cover 30 and the lower cover 31 of the radio apparatus 21, through which the mounting screws 24 and 25 pass, at locations at which the mounting screws 24 and 25 are passed through the radio apparatus 21, so that the tightening force on the mounting screws 24 and 25 is supported by the studs 32.

Each of the studs 32 is fixed to an internal chassis 33 by means of a flange 32a thereof, so that the structure is one in which the relationship to the adapter 1 is such that the entire radio apparatus 21 is supported by the studs 32.

Therefore, even if the mounting screws 24 and 25 are tightened strongly, the radio apparatus 21 can be completely fixed at the desired angle of inclination, with no deformation of the upper cover 30 and the lower cover 31.

It could happen, such as in the "electronic apparatus enclosure structure" of the Japanese laid-open patent application H11-261034, that the entire enclosure of the radio apparatus is a die-cast enclosure made of an aluminum or magnesium alloy or the like.

In this type of structure, the outer enclosure is divided between an upper housing and a lower housing, into one of which is mounted the printed circuit board with electronic components, the housings being joined to form the outer enclosure.

In the case of this structure, in contrast to the panels serving as the upper cover and the lower cover, while there is no flexure caused by the tightening of the mounting screws 24 and 25, if the surface area of the die-cast upper and lower housings is large, splitting or cracking can occur due to the tightening force, making reinforcement necessary.

Figure 8:
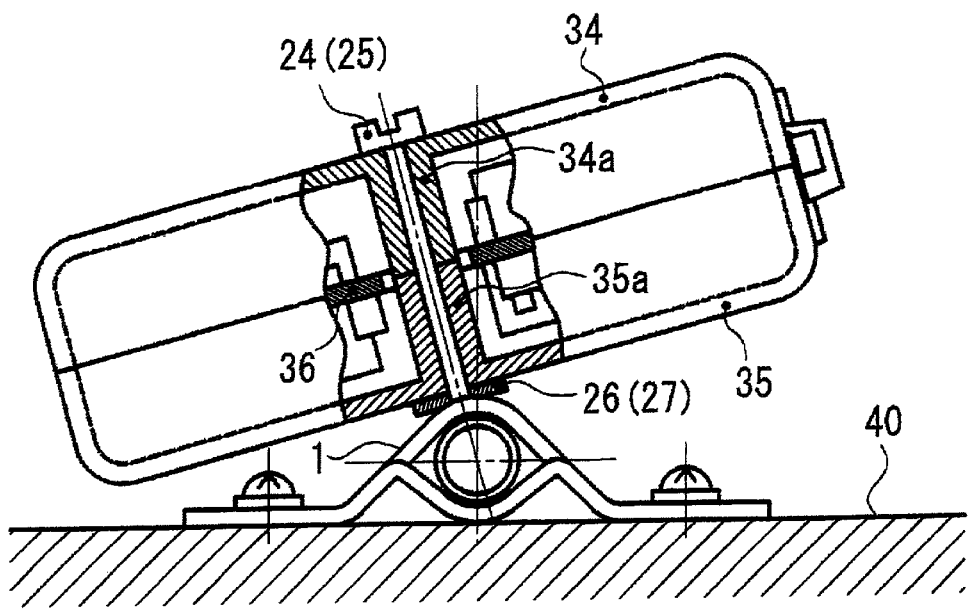
FIG. 8 is a side elevation showing the installation condition of a radio apparatus according to the third embodiment of the present invention (for the case in which the outer enclosure is of die-cast construction, formed by an upper and a lower housing), in which part of the radio apparatus is cut away to show the provision and holding of the vertical stud.
Figure 9:
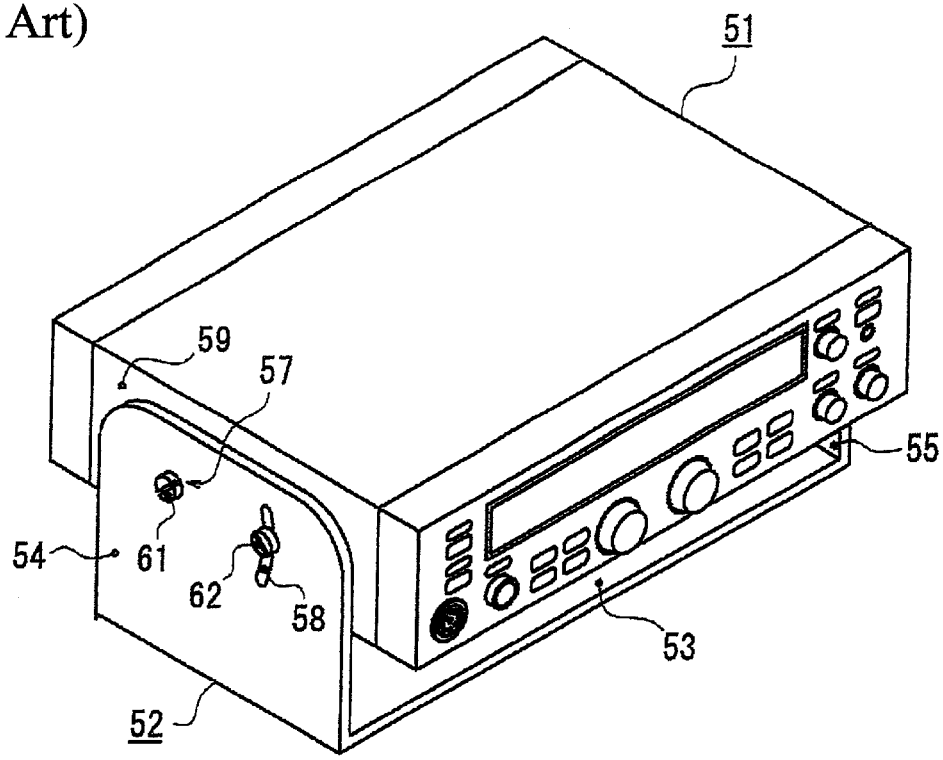
FIG. 9 is an outer perspective view showing the condition of a radio apparatus mounted to an installation bracket according to the prior art.
Figure 10:
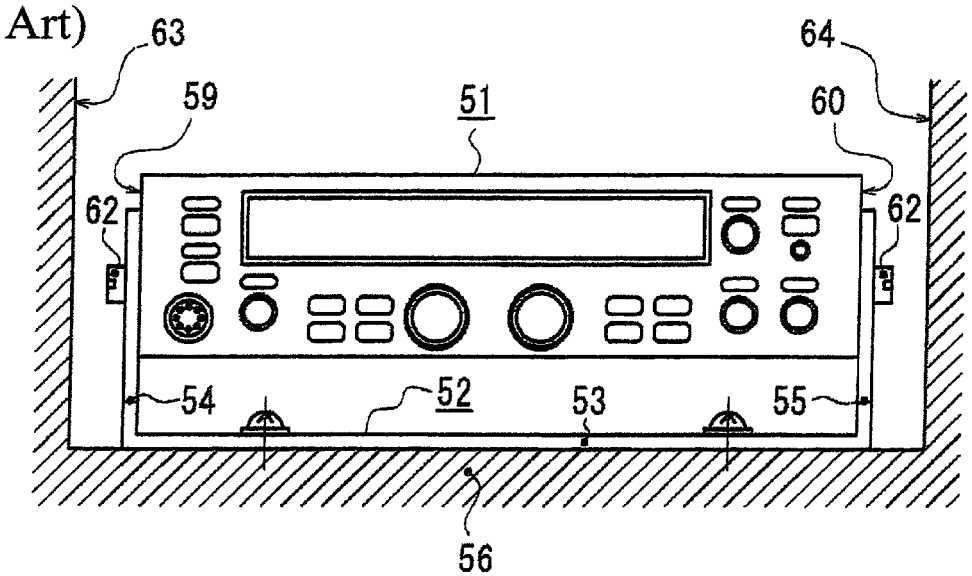
FIG. 10 is a front elevation showing the installation condition of a radio apparatus into a vehicular dashboard using an installation bracket according to the prior art.

Given the above, in the case of the above-noted structure, it can be envisioned that the construction shown in FIG. 8 be adopted.

In FIG. 8, reference numeral 34 is the upper housing, 35 is the lower housing, and 36 is a printed circuit board, and at positions in the housings 34 and 35 through which the mounting screws 24 and 25 pass, cylindrical studs 34a and 35a are integrally formed with heights that extend from the flat surfaces to the joining planes of the housings 34 and 35.

These studs 34a and 35a, of course, can be formed integrally when the housings 34 and 35 are cast, thereby eliminating the need to provide these elements separately.

Therefore, with the radio apparatus 21 completed by the combining of the upper housing 34 and the lower housing 35 as shown in FIG. 8, the end faces of the studs 34a and 35a, similar to the case of the stud 32 shown in FIG. 7, bear the tightening force of the mounting screws 24 and 25, thereby providing the same function.

While the foregoing embodiments are described for the case in which the radio apparatus 21 is fixed to the adapter 1 by means of two mounting screws 24 and 25, it will be understood that the number of mounting screws can be selected in accordance with the size and weight of the radio apparatus, and in the case of a small, lightweight radio apparatus it is possible to use a single mounting screw, in which case it is possible to cause the radio apparatus to swing about the mounting screw within the allowable limits between the side walls of the dashboard, so as to adjust the angle of the operating panel thereof.

Furthermore, while foregoing embodiments are described for the case in which movement and swinging restraint conditions with respect to the bracket 3 are established by the relationship of engagement between the elongated hole 13 and the pin 8, it will be understood that the present invention is not restricted to this mechanism, and that another mechanism that achieves these conditions can be used as well.

By adopting the above-described constitution, an electronic apparatus installation structure according to the present invention achieves a number of effects.

According to the present invention, in the case in which an electronic apparatus is set to a desired angle of inclination using an adapter, even if the installation width is narrow, so that sufficient installation space is not available on the sides of the electronic apparatus, it is possible to easily perform the task of adjusting and holding the electronic apparatus in place at the desired angle of inclination.

The above-noted effect is extremely prominent in the case of a vehicular radio apparatus mounted to a dashboard.

According to the present invention, it is possible to easily fabricate an adapter suitable for the invention using a pressing operation.

According to the present invention as recited in claim 3 of the accompanying claims, the friction between the electronic apparatus and the adapter is made large, enabling the achievement of stable mounting conditions even without a large tightening force on the mounting screws.

According to the present invention as recited in claim 4 of the accompanying claims, when an electronic apparatus is mounted to an adapter, the outer enclosure of the electronic apparatus is neither deformed nor damaged if the mounting screws are tightened strongly, and a reliable mounting condition is achieved.

What is claimed is:

1. An electronic apparatus installation structure comprising:

an adapter comprising a bearing part rotatably supporting a rotating shaft having one screw hole or a plurality of screw holes arranged in a line along an axis of a round rod and a base part supporting said bearing part, said bearing part and base part being integrally formed, a surface of said bearing part on an opposite side from said base part being formed as a substantially arc-shaped surface about an axis as a center, an elongated hole being formed in a circumferential direction at a location on said substantially arc-shaped surface opposing a screw hole of said rotating shaft, and in which a restraining mechanism provides restraint so that said screw hole between said rotating shaft and said bearing part does not exceed a limit over which said elongated hole is formed and move and rotate in an axial or circumferential direction; and an electronic apparatus having formed therein a through hole at a location corresponding to said screw hole on said adapter side, wherein said base part of said adapter is fixed to an installation location on said electronic apparatus, a mounting screw being passed through said through hole on said electronic apparatus and screwed into said screw hole on said adapter side, thereby fixing said electronic apparatus to said adapter.

2. An electronic apparatus installation structure according to claim 1, wherein said bearing part and said base part of said adapter are fabricated by a pressing operation performed on a metal sheet, whereby various regions of said metal sheet making up an upper side and a lower side of said bearing part are divided by a slit and an elongated hole is formed in said region constituting said upper side, after which said upper side region is pressed upward so as to form a substantially arc-shaped curved surface, and said lower side region is pressed upward so as to form as double-humped wave shape, thereby forming a bearing part internally encompassing a rotating shaft, enabling a part that is not pushed upward to serve as said base part.

3. An electronic apparatus installation structure according to claim 1 or claim 2, wherein a rubber or resin sheet in which a hole for passage of said mounting screw is formed, or a metal sheet to which is adhered a rubber sheet or resin sheet to the side in contact with the adapter is sandwiched between said adapter and said electronic apparatus.

4. An electronic apparatus installation structure according to any one of claim 1 to claim 3, further comprising a cylindrical stud interposed vertically between said adapter side cover and said cover on an opposite side at the location of said through hole for said mounting screw, wherein said mounting screw passes through the stud and is tightened into the screw hole on said adapter side.

* * * * *

UNITED STATES PATENT AND TRADEMARK OFFICE
CERTIFICATE OF CORRECTION

PATENT NO. : 6,364,271 B2
DATED : April 2, 2002
INVENTOR(S) : Yoshitune Iitsuka

It is certified that error appears in the above-identified patent and that said Letters Patent is hereby corrected as shown below:

Column 8,
Lines 28 and 29, delete "as recited in claim 3 of the accompanying claims"
Lines 33 and 34, delete "as recited in claim 4 of the accompanying claims"

Column 9,
Line 13, delete "or claim 2"

Column 10,
Line 6, delete "any one of" and "to claim 3"

Signed and Sealed this

Twenty-fourth Day of September, 2002

Attest:

Attesting Officer

JAMES E. ROGAN
Director of the United States Patent and Trademark Office